(12) United States Patent
Divakaruni et al.

(10) Patent No.: US 6,727,539 B2
(45) Date of Patent: Apr. 27, 2004

(54) EMBEDDED VERTICAL DRAM ARRAYS WITH SILICIDED BITLINE AND POLYSILICON INTERCONNECT

(75) Inventors: Ramachandra Divakaruni, Somers, NY (US); Ulrike Gruening, Munich (DE); Jack A. Mandelman, Stormville, NY (US); Larry Nesbit, Farmington, CT (US); Carl Radens, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/147,150

(22) Filed: May 16, 2002

(65) Prior Publication Data

US 2003/0003651 A1 Jan. 2, 2003

Related U.S. Application Data

(62) Division of application No. 09/897,868, filed on Jul. 2, 2001, now Pat. No. 6,429,068.

(51) Int. Cl.[7] .................. H01L 27/108; H01L 29/76; H01L 29/94; H01L 31/119
(52) U.S. Cl. .................................. 257/296; 257/288
(58) Field of Search ................. 257/68, 296, 288, 257/301, 303, 306, 347, 350

(56) References Cited

U.S. PATENT DOCUMENTS

| 5,497,017 A | 3/1996 | Gonazales ............... 257/306 |
| 6,001,721 A | 12/1999 | Huang ................... 438/597 |
| 6,083,794 A | 7/2000 | Hook et al. ............. 438/286 |
| 6,117,723 A | 9/2000 | Huang ................... 438/238 |
| 6,117,732 A | 9/2000 | Chu et al. ............... 438/264 |
| 6,133,083 A | 10/2000 | Lin et al. ............... 438/238 |
| 6,153,459 A | 11/2000 | Sun ..................... 438/238 |
| 6,153,902 A | 11/2000 | Furukawa et al. ......... 257/301 |
| 6,258,659 B1 * | 7/2001 | Gruening et al. ......... 438/243 |
| 6,261,894 B1 * | 7/2001 | Mandelman et al. ....... 438/238 |
| 6,429,068 B1 * | 8/2002 | Divakarumi et al. ....... 438/243 |

FOREIGN PATENT DOCUMENTS

JP         11284146        10/1999

* cited by examiner

*Primary Examiner*—David Nhu
(74) *Attorney, Agent, or Firm*—Ira D. Blecker; Cantor Colburn LLP (57) ABSTRACT

A structure and process for fabricating embedded vertical DRAM cells includes fabricating vertical MOSFET DRAM cells with silicided polysilicon layers in the array regions, the landing pad and/or interconnect structures, the support source and drain regions and/or the gate stack. The process eliminates the need for a M0 metallization layer.

11 Claims, 10 Drawing Sheets

EMBEDDED VERTICAL DRAM ARRAYS WITH SILICIDED BITLINE AND POLYSILICON INTERCONNECT

CROSS REFERENCE TO RELATED APPLICATIONS

This application is divisional application of U.S. Ser. No. 09/897,868, filed on Jul. 2, 2001, now U.S. Pat. No. 6,429,068, the contents of which are incorporated by reference herein in their entirety.

FIELD OF THE INVENTION

The present invention relates to a method for fabricating semiconductor circuits containing both DRAM and logic cells. In particular, the invention relates to fabricating semiconductor circuits containing vertical pass gate embedded DRAM (EDRAM) arrays and dual workfunction logic gates.

BACKGROUND OF THE INVENTION

With the advent of Large Scale Integration (LSI), many integrated circuit designs include several circuit functions on a single semiconductor substrate, such as memory storage and logic functions for addressing and accessing the memory. In the case where a logic region and a DRAM cell (memory) region are formed on the same substrate, the circuitry is commonly referred to as an embedded DRAM. The integration of logic and memory regions improves overall device performance by decreasing communication delays between memory devices on one chip and logic devices located on a second chip. In addition to the improvements in device performance, processing costs for integrating memory and logic circuit functions on the same semiconductor substrate potentially could be reduced due to the sharing of specific processing steps used to fabricate both types of devices. Present trends in DRAM technology are driving towards continued scaling of minimum feature size (F) in the DRAM array, and more compact cell layouts (e.g., $7F^2$, $6F^2$, etc.). As a result, the above noted problems in the prior art become even more problematic, especially for devices where F=100 nm and smaller.

DRAM circuits will usually include an array of memory cells interconnected by rows and columns, which are known as wordlines and bitlines, respectively. Reading data from, or writing data to the memory cells is achieved by activating selected wordlines and bitlines. Typically, the DRAM memory cell comprises a MOSFET (metal oxide semiconductor field effect transistor) connected to a capacitor. The MOSFET generally includes a gate region and diffusion regions. The diffusion regions, depending on the operation of the transistor, are often referred to as either drain or source regions.

There are different types of MOSFETs. Trench-gated MOSFETs are a class of MOSFETs in which the gate is positioned in a trench that is formed at the surface and extends into the silicon. The gate is formed in a lattice-like geometric pattern which defines individual cells of the DRAM; the pattern normally taking the form of closed polygons (squares, hexagons, etc.) or a series of interdigitated stripes or rectangles. The current flows in vertical channels which are formed adjacent to the sides of the trenches. The trenches are filled with a conductive gate material, typically doped polysilicon, which is insulated from the silicon by a dielectric layer normally consisting of silicon dioxide.

The trench-gated MOSFETs are normally formed by etching trenches of various dimensions into a silicon substrate. The gate trenches normally extend into the substrate and are frequently rectangular, with flat bottoms bounded by corners. Trenches commonly contain storage capacitors below the MOSFETs and have N+ doped polysilicon as one plate of the capacitor (a storage node). The other plate of the capacitor is formed usually by diffusing N+ dopants out from a dopant source into a portion of the substrate surrounding the lower part of the trench. Between these two plates a dielectric layer is placed which thereby forms the capacitor.

Typically, isolation regions are formed in the substrate to prevent carriers from traveling through the substrate between adjacent devices. The isolation regions are generally thick field oxide regions extending below the surface of the semiconductor substrate. One such technique for forming the isolation region is the local oxidation of silicon, i.e., LOCOS regions. LOCOS field oxidation regions are formed by first depositing a layer of silicon nitride on the substrate surface and then selectively etching a portion of the silicon nitride layer to form a mask exposing the substrate where the field oxidation will be formed. The masked substrate is then placed in an oxidation environment and a thick layer of oxide is selectively grown in the exposed mask regions forming an oxide layer extending above and below the substrate surface. An preferred alternative to LOCOS field oxidation is the formation of shallow trench isolation regions in contemporary CMOS technology, commonly referred to by those in the art as an STI region. In the process of forming the STI regions, a deep trench is formed in the semiconductor substrate by, for example, anisotropic etching. The trench is then filled with oxide back to the surface of the substrate to provide an isolation region between adjacent devices.

In a typical DRAM array, the wordlines need to be capped with an insulator to allow formation of borderless diffusion contacts, whereas in the logic supports the gate conductors must be exposed to allow the introduction of dual workfunction doping and silicidation. Silicided gates and source/drain regions greatly complicate the processes for forming array MOSFETs since the array MOSFETs need bitline contacts which are borderless to adjacent wordline conductors. In addition, it has been found that silicide junctions in the array frequently result in increased current leakage of the memory device. Conventional solutions to these integration problems require additional masking steps to remove the insulating gate cap from the support MOSFETs prior to the silicidation process.

Problems encountered in the formation of vertical pass gate embedded DRAM (EDRAM) arrays and dual workfunction logic gates include the lithography steps used to simultaneously form the support gates and wordlines. The wordlines used in the array have tight pitch requirements whereas the support regions have relatively relaxed pitch features. Lithographic patterning these different pitches typically requires complex solutions, such as alternating phase shift masking techniques and the like, to overcome these difficulties. It is desirable to have the pitch requirements for the array and supports be similar or more relaxed to overcome these well known lithographic problems. However, this is not currently feasible as circuitry density increases and as such, common practice is to separately pattern the array and supports.

Another problem with prior art processes is in the formation of the local interconnects. Conventionally, one of the metallization layers is used for forming both the bitline and the local interconnects. It is preferred to have a simpler process that eliminates the metallization layer and its attendant processing to form the local interconnect and metal layer. U.S. patent application Ser. No. 09/725,412 to Mandelman et al. filed on Nov. 29, 2000 shows how to form dual work function logic gates with vertical DRAM cells using a raised shallow trench isolation (RSTI) process. This process has the disadvantage that the support logic devices are subject to the thermal processes of the shallow trench isolation which can degrade the well profile.

U.S. patent application Ser. No. 09/706,492 to Mandelman et al. filed on Nov. 3, 2000 overcomes many of the above noted thermal problems. The process disclosed therein generally includes a) patterning only the array gate wiring for the vertical transistors; b) forming silicided bitlines and peripheral transistors concurrently and c) showing a metal to form local interconnects. However, this methodology becomes difficult to implement for tight array pitches patterned with 193 nm lithography.

Accordingly, there is a need for improved processes that address these concerns and provide a process that can be used for the more compact cell layouts.

BRIEF SUMMARY OF THE INVENTION

A process and structure for producing high density embedded DRAM and logic structures is described. The process includes fabricating embedded vertical DRAM arrays with a silicided bitline and a polysilicon interconnect. In one embodiment, the method of forming a memory array and support transistors on a semiconductor substrate comprises providing a substrate including a memory structure having an array region and a support region separated by an isolation region, wherein the array region includes a plurality of dynamic random access memory cells embedded in the substrate, wherein adjacent dynamic random access memory cell are connected to each other through bitline diffusion regions, and wherein the memory structure is capped with a top oxide layer; applying a block mask to protect the array region while stripping the top oxide layer from the support region; forming support implants, forming a support gate oxide layer and patterning a first polysilicon layer onto the support gate oxide layer; forming a tungsten nitride, tantalum nitride or titanium nitride layer on all exposed surfaces of the substrate; forming a conductive metal layer on the nitride layer; forming an insulating layer on the conductive metal layer; removing portions of the conductive nitride layer, the conductive metal layer and the dielectric capping layer from the support region to form a support gate structure, wherein the support gate structure comprises the gate oxide layer, the first polysilicon layer, the conductive nitride layer, the metal layer and the dielectric capping layer, wherein the support gate structure further includes forming an insulated spacer on the sidewall of the gate structure and removing the conductive nitride layer, the conductive layer and the dielectric capping layer structure from the isolation region to define a local interconnect region; forming a protective layer on all exposed surfaces of the substrate; forming an array gate structure in contact with the memory cell and exposing a portion of the bitline by removing portions of the protective layer, the conductive nitride layer, the metal layer and the dielectric capping layer from the array region, and simultaneously removing the protective layer from the isolation region; forming an spacer layer on sidewalls of the array gate structure; depositing a second polysilicon layer onto the substrate; selectively patterning and etching the second polysilicon layer in the isolation region to forma landing pad while removing the polysilicon layer in the support regions; and simultaneously forming silicide layers on an exposed portion of the source and drain regions in the support region, on the second polysilicon layer overlaying the bitline diffusion regions in the array region, and on the second polysilicon layer defining the landing pad.

In another embodiment of the process, the method of forming a memory array and support transistors on a semiconductor substrate includes providing a memory structure having an array region and a support region separated by an isolation region, wherein the array region includes a plurality of dynamic random access memory cells embedded in the substrate, wherein adjacent dynamic random access memory cells are connected to each other through bitline diffusion regions which are capped with a top oxide layer; depositing a barrier layer, a metal layer, and a dielectric capping layer onto the substrate; removing portions of the barrier layer, the polysilicon layer, and the dielectric capping layer from the substrate to form an array gate structure; depositing a layer of nitride onto the substrate and removing the nitride layer from the non-array regions and the top oxide layer in the support region; forming a support sacrificial oxide layer, forming support implants, removing the sacrificial layer and forming a support gate oxide layer; depositing a first layer of polysilicon onto the substrate and etching the first polysilicon layer to the support gate oxide to form a support gate structure; forming spacers on the sidewalls of the array gate structure and support gate structure, wherein the spacer is removed in array regions for forming a bitline contact; depositing a second polysilicon layer and applying a mask to pattern and form a landing pad in the array and gate conductors for the support transistors; siliciding the landing pad, the support gate structure, the support gate conductors and the second polysilicon layer overlying the bitline diffusion regions in the array region.

In another embodiment of the process, a method of forming a memory array and support transistors on a semiconductor substrate includes forming a trench capacitor in a silicon substrate having a gate oxide layer, a polysilicon layer, and a top cap layer deposited thereon; patterning an array gate structure by removing portions of the polysilicon layer and the cap layer; depositing a nitride layer onto the substrate; applying a patterned mask to selectively etch the nitride layer in the support region and isolation region, and forming a sacrificial oxide layer; forming implants in the support region and subsequently stripping the sacrificial oxide layer and forming a gate oxide layer; depositing and patterning a second layer of polysilicon in the support region to the gate oxide layer and the gate cap layer forming the gate stack. and in the array region patterning the second polysilicon layer to the nitride layer; depositing a second layer of nitride onto the substrate and a layer of tetraethylorthosilicate thereon; removing portions of the tetraethylorthosilicate layer in the array region and in a region where a local interconnect is formed; conformally depositing a third layer of polysilicon onto the substrate and planarizing the third polysilicon layer over the gate stack in the support region; patterning the third polysilicon layer to define the local interconnect, and in the support region, further removing the nitride layer and simultaneously forming implants therein and doping the gate stack; and siliciding the exposed portions of the polysilicon layer in the array region and the local interconnect.

A semiconductor device including a dual workfunction support transistor and an embedded DRAM array free of a M0 first metal layer includes a support region comprising a gate structure, a source and a drain region adjacent to the gate structure, and a silicide layer disposed on the source and drain regions, wherein the gate structure comprises a dielectric capping layer, a metal conductor and a polysilicon layer; an array region comprising a plurality of embedded DRAM cells, a bitline diffusion region electrically connecting adjacent DRAM cells, a polysilicon layer and a silicide layer disposed on the polysilicon layer; an isolation region, wherein the isolation region electrically separates the support region from the array region; and an interconnect structure disposed on the isolation region comprising a polysilicon layer and a silicide layer formed on the polysilicon layer.

In another embodiment, the semiconductor device structure includes a support region comprising a gate structure, source and drain regions adjacent to the gate structure, and a silicide layer disposed on the source and drain regions, wherein the gate structure comprises a dielectric capping layer, a metal conductor and a polysilicon layer; an array region comprising a plurality of embedded DRAM cells, a bitline diffusion region electrically connecting adjacent DRAM cells, an array gate stack structure, a polysilicon layer, wherein the polysilicon layer includes a silicide surface; an isolation region, wherein the isolation region electrically separates the support region from the array region; and an interconnect structure disposed on the isolation region comprising a polysilicon layer and a silicide layer formed on the polysilicon layer.

In another embodiment, the semiconductor device structure includes an active wordline comprising a first gate structure formed on a storage capacitor, wherein the first gate structure comprises a metal conductor layer, a dielectric capping layer and a spacer layer formed on a portion of the first gate structure; a passing wordline spaced apart from the active wordline, the passing wordline comprising a second gate structure, wherein the second gate structure comprises a metal conductor, a dielectric capping layer, an underlying oxide layer and a spacer layer formed on a portion of the second gate structure; a bitline diffusion region separating the active wordline from the passing wordline; and a landing pad comprising polysilicon having a silicide surface, wherein the landing pad is in contact with the first gate structure, the second gate structure and the bitline diffusion region.

In another embodiment, the semiconductor device structure includes an array region comprising a plurality of embedded DRAM cells, a bitline diffusion region electrically connecting adjacent DRAM cells, an array gate stack structure overlaying each DRAM cell, and a silicide polysilicon layer, wherein the gate structure comprises a metal conductor layer and a dielectric capping layer and wherein the silicide polysilicon layer is in contact with the bitline diffusion region and the dielectric capping layer; a support region comprising a polysilicon gate structure, a source and a drain region adjacent to the gate structure, and a silicide layer disposed on the gate structure and the source and drain regions; and an interconnect structure overlaying an isolation region, separating the support region from the array region, wherein the isolation region include a silicide polysilicon layer.

Advantageously, the process and structure eliminates the need for a M0 first metallization layer for sub-$8F^2$ cells.

Other embodiments of the invention are contemplated to provide particular features and structural variants of the basic elements. The specific embodiments referred to as well as possible variations and the various features and advantages of the invention will become better understood when considered in connection with the accompanying drawings and detailed description that follows.

DETAILED DESCRIPTION OF PREFERRED EMBODIMENTS

The present invention is directed to a process for fabricating a vertical embedded DRAM array and dual workfunction support devices on a semiconductor substrate. The process, in accordance with the present invention, advantageously eliminates numerous processing steps relative to conventional fabrication. A metallization layer is commonly used for forming both the bitline and the local interconnects. This metal layer is commonly referred to as the M0 layer. In the present process, the local interconnects and bitlines are both silicided, thereby eliminating the need for the M0 metal layer as well as numerous process steps typically required to form the metal layer. Moreover, the silicidation of the bitlines (especially advantageous for sub $8F^2$ cells) relaxes the pitch requirement needed to form the first metal layer since the M0 metal layer generally has the tightest pitch requirements and presents the greatest photolithographic challenges. The use of relaxed pitches for the metal layers advantageously minimizes the well known difficulties associated with conventional lithographic patterning of dense (memory type) and isolated (logic type) features within the same layer. As a result, proximity effects during lithographic processing are minimized. Consequently, reliance on complicated optical proximity correction schemes, alternating phase shift masking techniques and the like is reduced significantly since formation of the first metal layer (i.e., M0 layer) is no longer required.

FIGS. 1–5 are schematic, cross-sectional diagrams used to depict steps in an embodiment for fabricating a vertical embedded DRAM and logic support on the same substrate.

Figure 1:
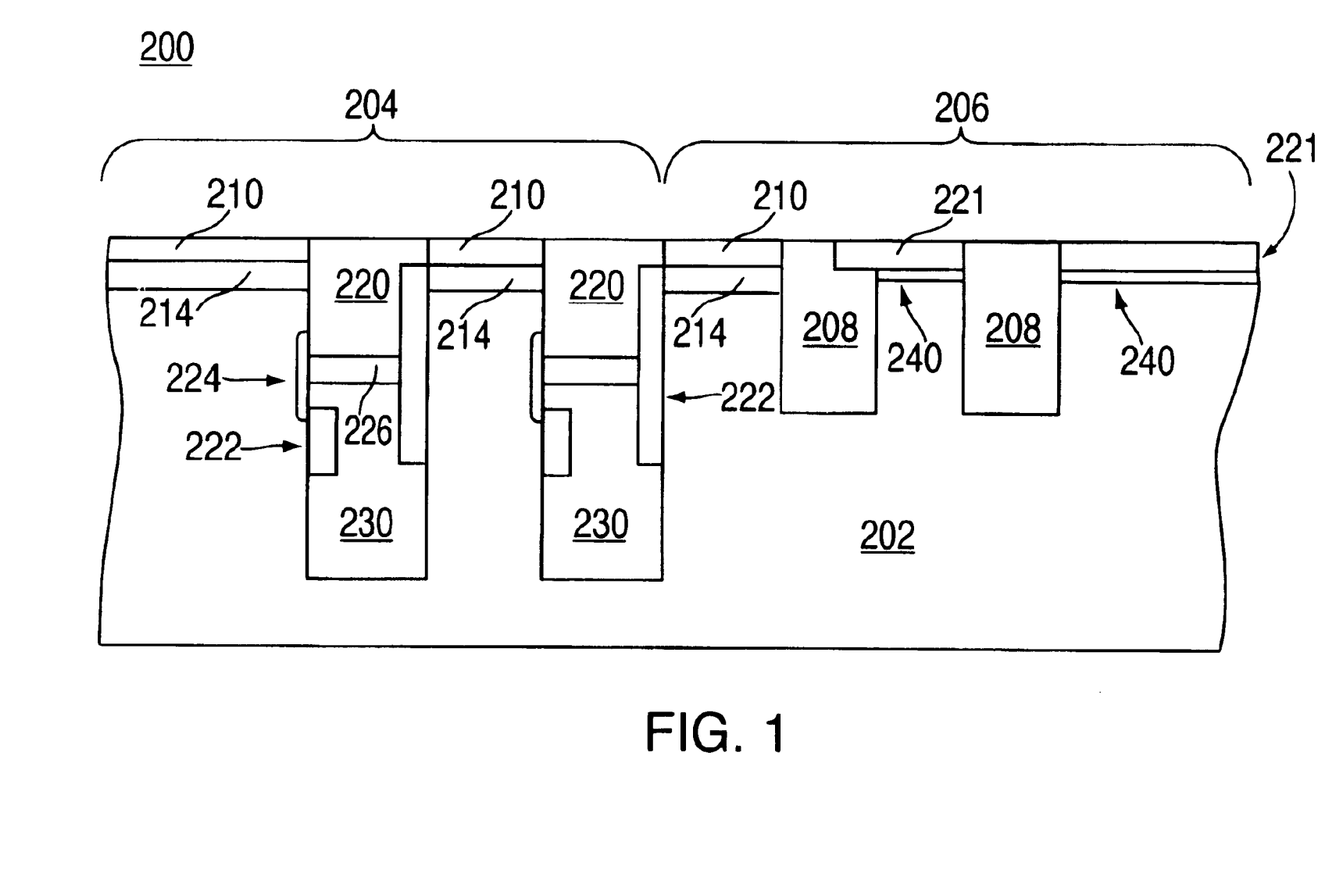
FIGS. 1–5 show schematic cross-sectional views illustrating fabrication of a DRAM array and supports constructed in accordance with an embodiment of the present invention.

Turning now to FIGS. 1, the illustrated integrated circuit, generally designated as reference number 200, is a suitable substrate for practicing the present invention. The integrated circuit includes a memory circuit region 204 and a logic circuit region 206 on a semiconductor substrate 202, wherein the memory circuit region 204 and the logic circuit region 206 are separated by an isolation region 208. Although the drawings depict the isolation region as a shallow trench isolation (STI) region, the invention is not to be construed as being limited to STI regions. Suitable semiconductor substrates include, but are not limited to, Si, SiGe, Si/SiGe, silicon-on-insulators (SOI) and the like.

It is noted that the drawings illustrate only one of each region 204 and 206 in the structure. In practice, depending on the design, the substrate may include numerous memory and support regions. Standard processing known in the art for fabricating vertical MOSFET DRAMs in the substrate 202 is applied through the step of defining an active area and after shallow trench isolation planarization. These standard processing techniques include formation of the storage capacitors in deep trenches, depositing a top oxide layer (TTO) 210, forming array well implants, forming an implant for bitline diffusion region 214 for connecting adjacent vertical DRAMs, removing the original pad structure, and growing a vertical gate oxide layer and a gate conductor layers 220. The array gate polysilicon layer 220 is separated from an underlying deep trench polysilicon region 230 by a trench top oxide layer 226. The bitline diffusion region 214 is formed in the substrate 202 between adjacent vertical DRAM cells and serves to electrically connect the bitline contact of the DRAM cells shown in FIG. 1. Also included are a collar region 222 and a buried strap 224.

The present invention is not limited to the exact memory structure shown in the figures. The DRAM cells may also include a buried exterior counter-electrode about the trench, or a counter-electrode formed inside the trench and a node dielectric formed on the counter-electrode. Deep trench polysilicon is formed on the node dielectric. Other memory structures which include the basic elements shown, but having different configurations are also contemplated herein. FIG. 1 shows the structure of a particular sub-$8F^2$ cell, but the invention may be modified for other sub-$8F^2$ cells or for an $8F^2$ vertical pass gate DRAM cell as will be discussed in further detail below.

A block mask is used to selectively etch the TTO layer 210 from the support region 206 and polysilicon 221 is then deposited therein (after the support implants and support gate oxidation). The gate oxide layer is formed by recognized procedures and is shown as reference numeral 240. The polysilicon layer 221 is subsequently etched using a mask from the array region 204. The thickness of the top oxide layer 210 and polysilicon 221 are approximately the same.

The dual workfunction implants may be performed at this time in the support polysilicon using conventional photolithographic processing. Depending on the particular desired circuitry, the gates in the support region can be defined as either a P channel (PFET device) or as an N channel (NFET device). In the case of PFET devices, selective implantation of boron dopant ions is preferably performed in the polysilicon 221 of the support regions, whereas in NFET devices, selective implantation of arsenic or phosphorous ions is preferably employed. The energies, doses and selective processing required for each channel type are conventional and well within the skill of those in the art. The ion implantation of NFET supports may also be used for doping the polysilicon gates in the DRAM region. In contrast, during definition of the PFET logic gate structures, the DRAM region is protected by a layer of photoresist. Residual photoresist after processing each type of channel is removed with conventional plasma ashing and subsequent wet cleans as is known to those skilled in the art. A rapid thermal anneal (RTA) procedure can then be used to activate all of the doped regions or alternatively, the RTA procedure can be performed during subsequent processing of the integrated circuit.

Figure 2:
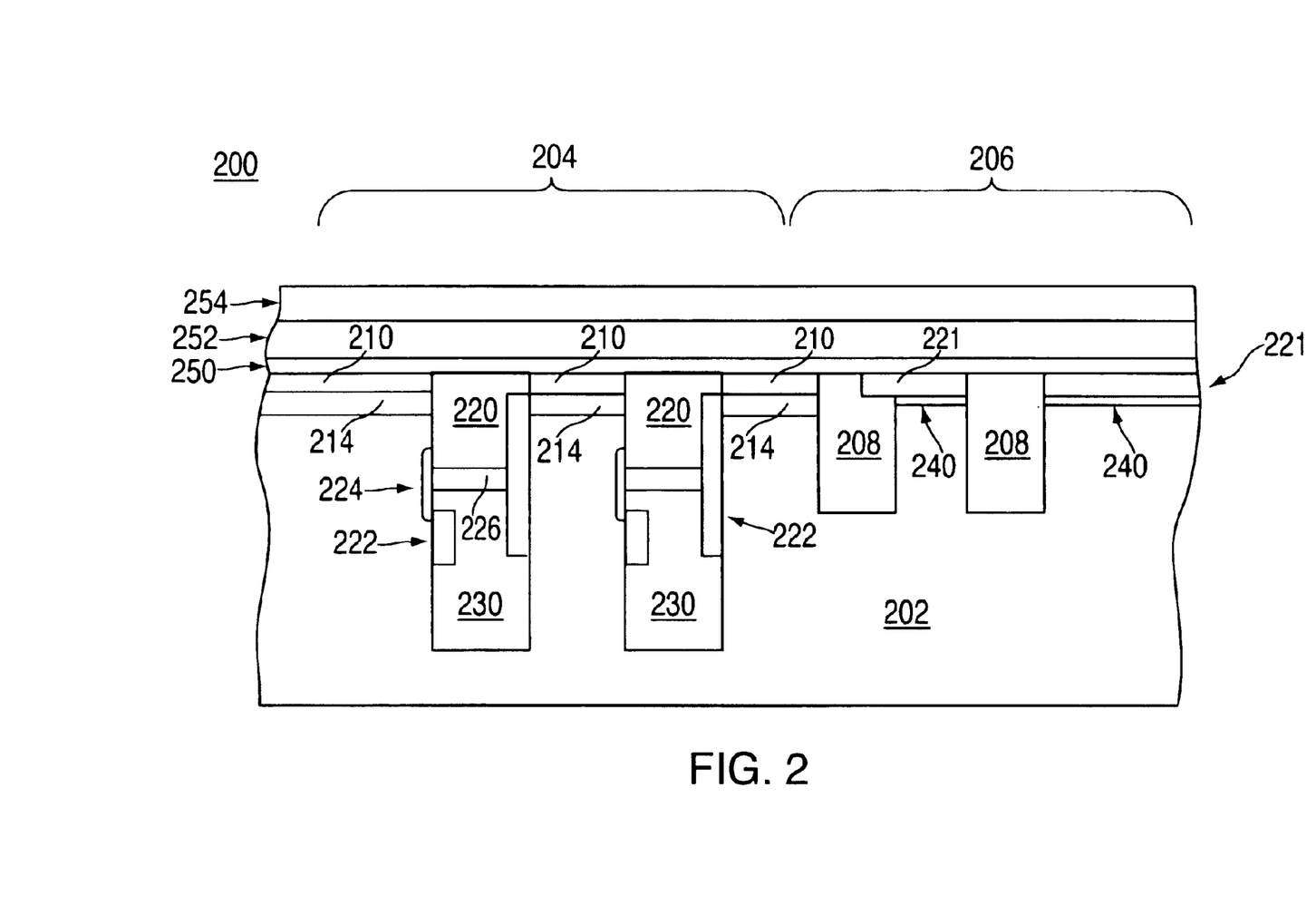

FIG. 2 illustrates the memory structure after various layers have been formed in the support and array regions. The support polysilicon 221 is separated from the underlying surface by the gate oxide layer 240. A barrier layer 250 is deposited onto the array and support surfaces using conventional deposition processes such as chemical vapor deposition (CVD), plasma assisted CVD, sputtering and the like. Preferably, the barrier layer is formed from a metallic nitride composition. Nitrides suitable for use in the present invention include, but are not limited to titanium nitride, tantalum nitride, tungsten nitride and the like. Other materials suitable for use as barrier layers will be apparent to those skilled in the art in view of this disclosure. The thickness of the barrier layer may vary and is not critical to the present invention. Optionally, a thin silicon layer may be sputtered (or deposited) to help with adhesion of the barrier layer to the top oxide layer 210 in the array.

Figure 3:
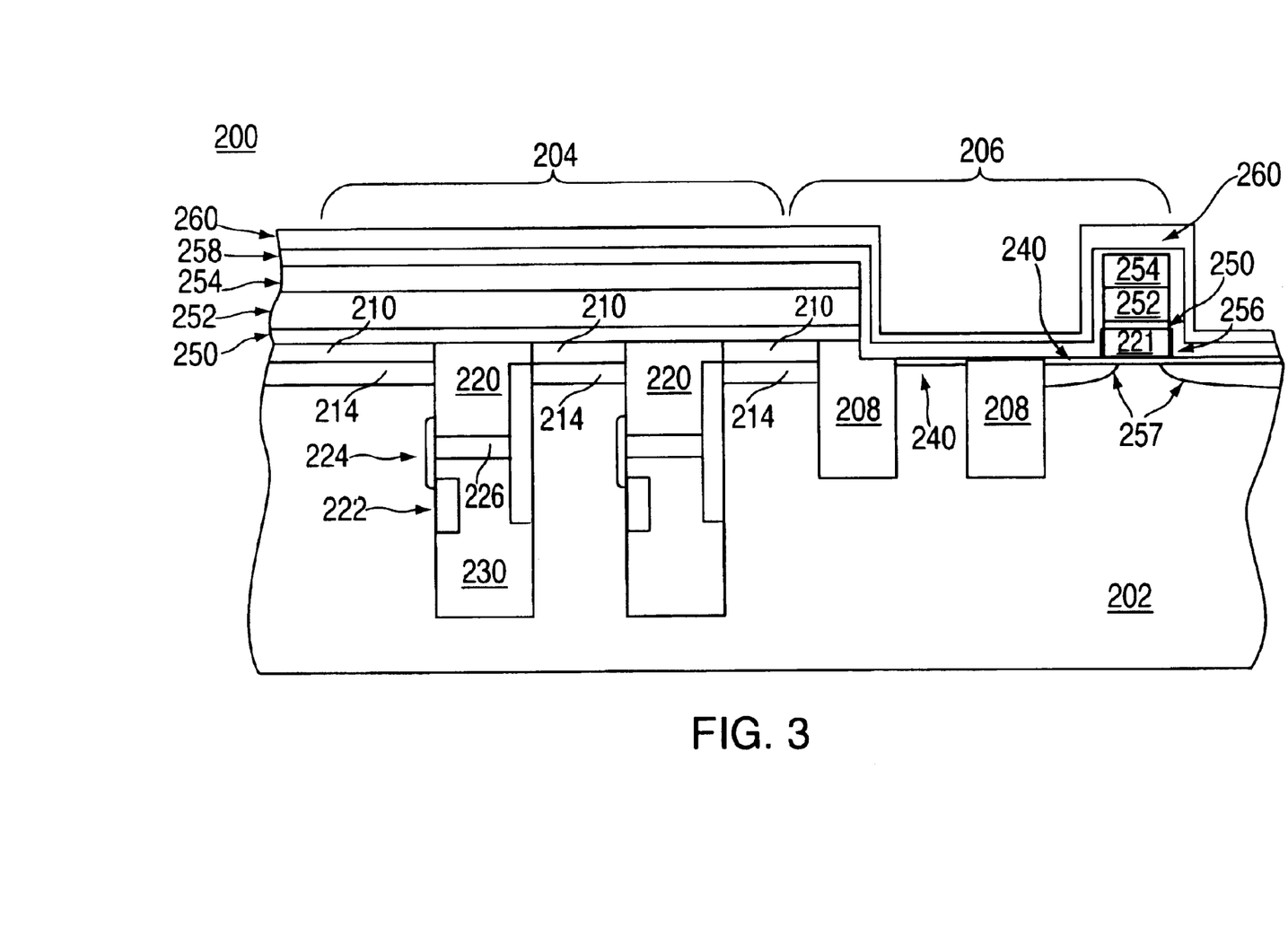

A metal conductor layer 252, preferably a tungsten silicide ($WSi_x$) tungsten (W) layer, is next deposited utilizing one of the conventional deposition processes described above. The metal conductor layer 252 is used to form the wordline stack in the array region. It should be noted that the process is not limited to this particular wordline structure. The thickness of the conductor may vary depending on the deposition process. The metal conductor 252 is capped with a thick layer of dielectric material 254, such as tetraethylorthosilicate (TEOS) or silicon nitride or TEOS with a thin layer of silicon nitride (SiN) on top (not shown). The deposited dielectric layer 254 forms an insulating cap over the wordline conductors. Preferably, the dielectric material 254 is a TEOS layer with a thin layer of about 10–30 nm of SiN on its upper surface. Then, using conventional lithography and etching processes, the gate stacks in the support region 206 are patterned as shown in FIGS. 3 and 4.

At the time of patterning the array wordlines, the stack thickness in both the array and support regions are approximately coplanar. The support logic gates are first patterned and etched to the gate oxide layer 240 using conventional processes. At this point, gate sidewall oxidation layers 256 are grown on the sidewalls of the gate stacks, followed by deposition of a thin dielectric layer 258 onto the substrate. Preferably, the dielectric layer is silicon nitride at a thickness of about 10 nm. The support extension implants 257 are performed and an insulating layer 260 of TEOS is deposited onto the substrate.

Figure 4:
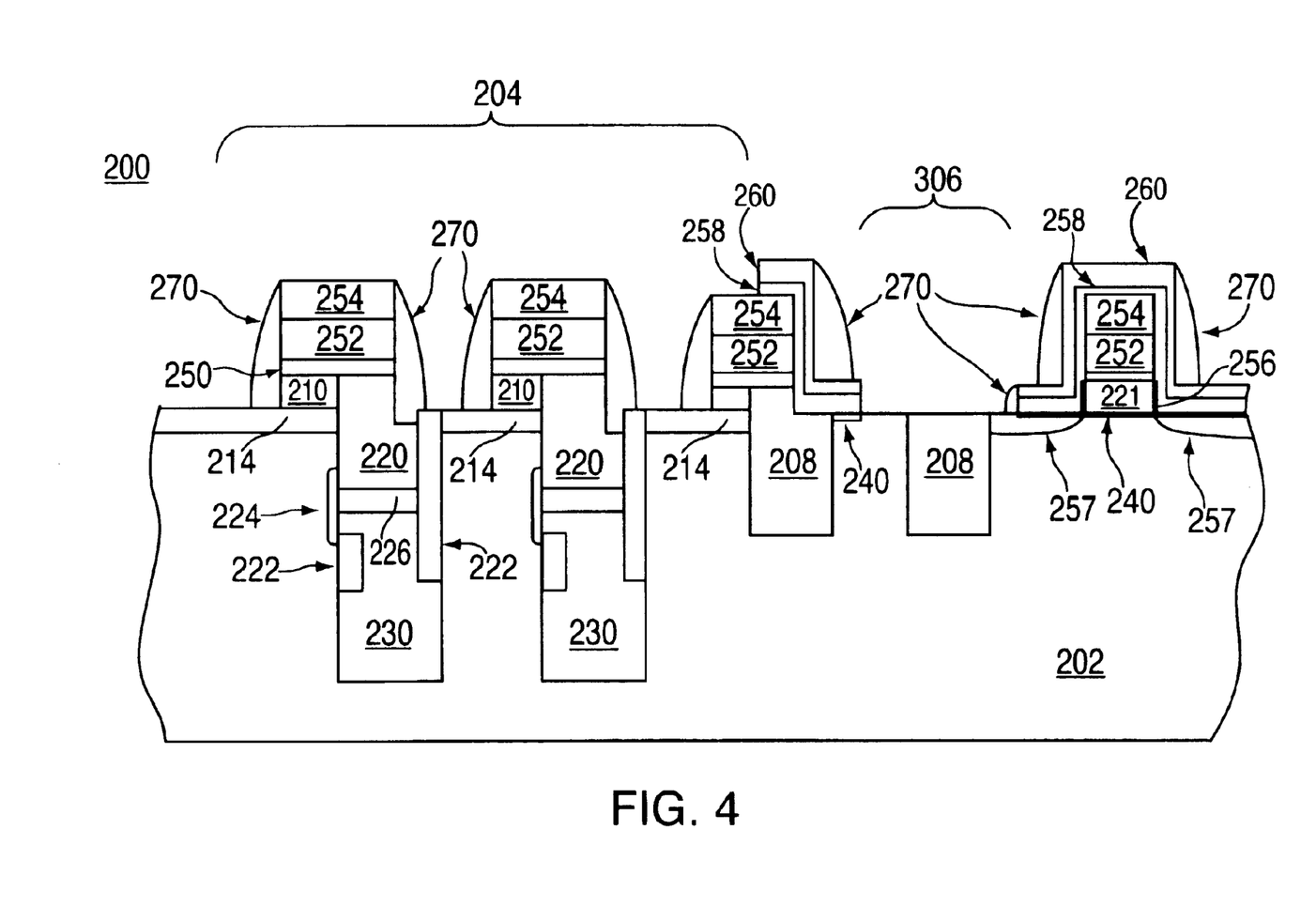
Figure 5:
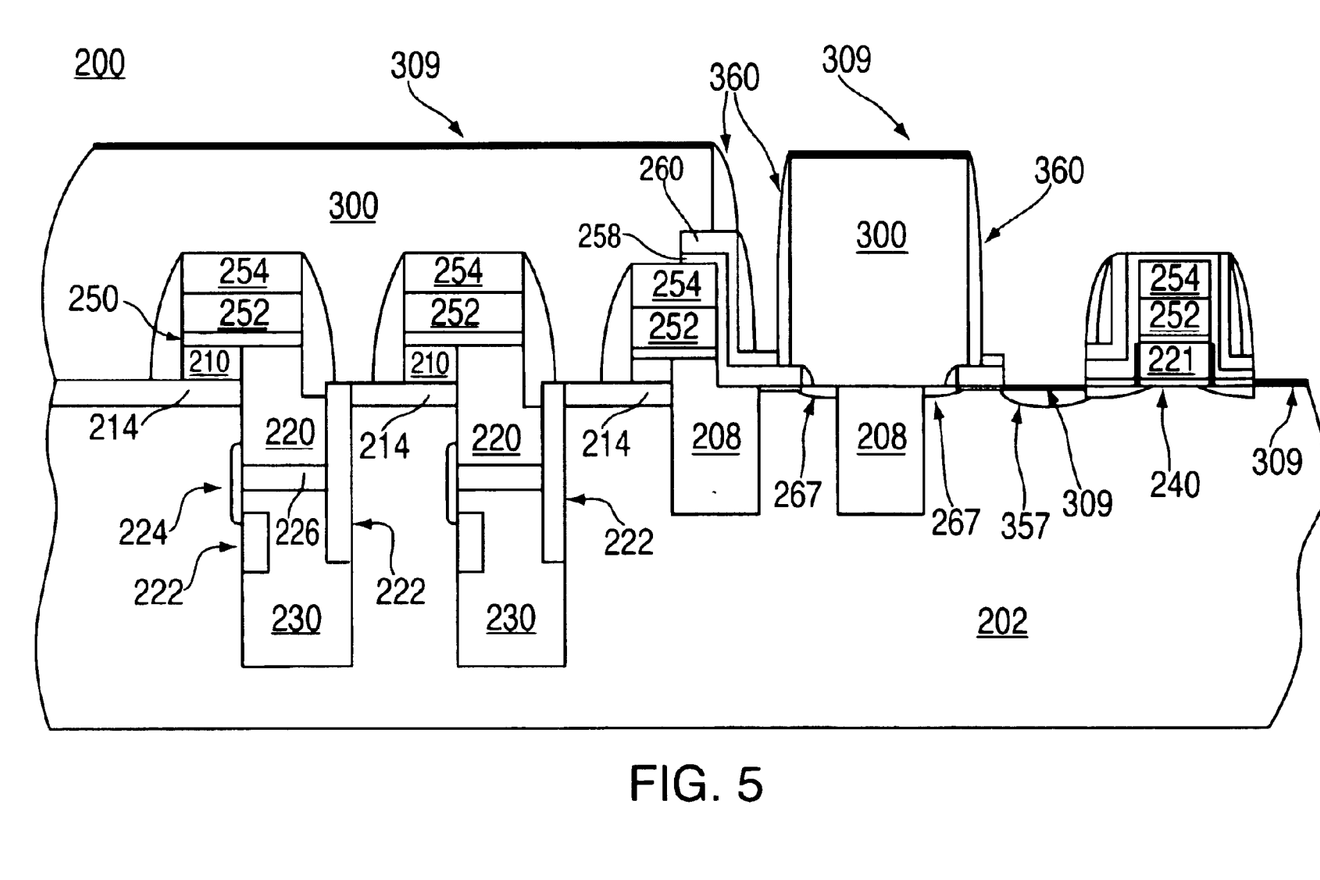

FIGS. 4–5 illustrate the memory and support regions after defining the memory and support stacks. The array wordlines are patterned and etched. The support regions are protected by oxide layer 260. A resist mask is then applied and exposed in the array and in regions where a local interconnect 306 is to be formed. The top oxide layer 210 is removed in the array region selective to the top of the dielectric layer 254. The oxide and dielectric layers 260 and 258 respectively, are also removed in regions where the local interconnect 306 is to be formed. For example, portions of the top oxide layer 210 (as shown in FIG. 3) are removed over the bitline diffusion regions 214 in the array region 204. In addition, the dielectric layer 258 is selectively removed to expose the ($n^+$) interconnect regions as shown in FIG. 4. Silicon nitride spacers 270 are then formed on the sidewalls of the memory stacks in the array region. A second layer of $n^+$ doped polysilicon 300 is conformally deposited over the substrate and planarized to a level above the gate stack. Polishing may be used to planarize the doped polysilicon surface and is accomplished by conventional chemical mechanical polishing techniques known to those skilled in the art.

A hardmask, such as boron silicate glass (BSG) phosphorous silicate glass (PSG), arsenic silicate glass (ASG) or the like may then be applied and the second layer of polysilicon 300 is patterned with a photoresist mask and selectively etched to the STI oxide 260 in the array, selectively etched to the dielectric layer in the interconnect region, and completely removed from the support regions. If a hardmask is utilized, it is then stripped selective to the substrate. If needed, an additional oxide layer, such as TEOS, is then deposited and spacers 360 etched. These additional spacers form on the sides of the bitline and local interconnect. The nitride 258 is then etched. The deep n+ and p+ implants 357 are performed while masking the PFETs and NFETs respectively. The outdiffused n-type dopant forms n+ junctions 267 in regions of the local interconnects.

Silicide regions 309 are then formed on surfaces of the exposed polysilicon 300. Specifically, the silicide regions are formed on the array bitline diffusion region, the interconnects and the support source/drain region. A rapid thermal anneal procedure or the like is used to form the silicide regions. FIG. 5 illustrates the resulting structure with the silcided regions 309. It should be noted that selective silicidation of the polysilicon layer 300 and the support source/drain regions eliminates the need for an M0 metal layer for sub-8F$^2$ cells FIG. 5 is intentionally showing a different interconnect as would be expected from FIG. 4 to show the different structures possible. FIG. 5 shows silicided junctions and a silicided interconnect separate from the junctions.

Standard processing then continues to form the various wiring levels, vias and interlevel dielectric layers. For example, an interlevel dielectric layer may be deposited on the structure, patterned and etched to form vias or the like in the interlevel dielectric layer.

Figure 6A:
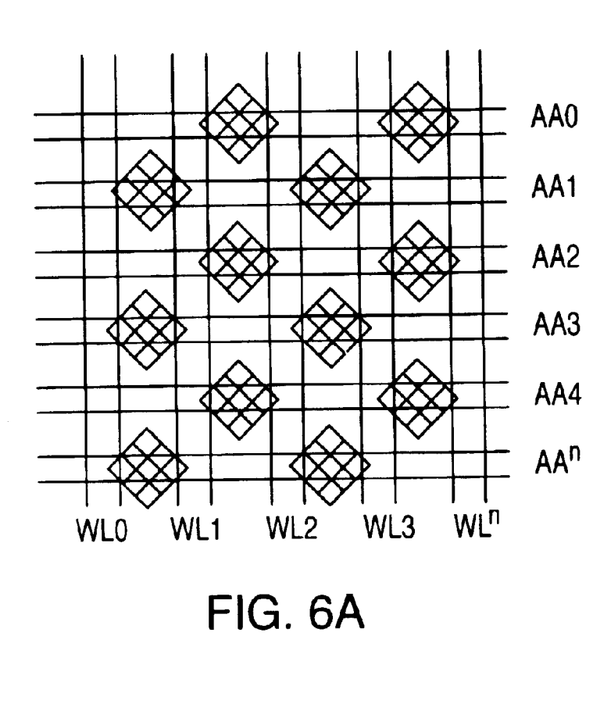
FIGS. 6A and 6B show schematic top down and cross-sectional views illustrating fabrication of a DRAM array and supports constructed in accordance with an embodiment of the present invention.
Figure 6B:
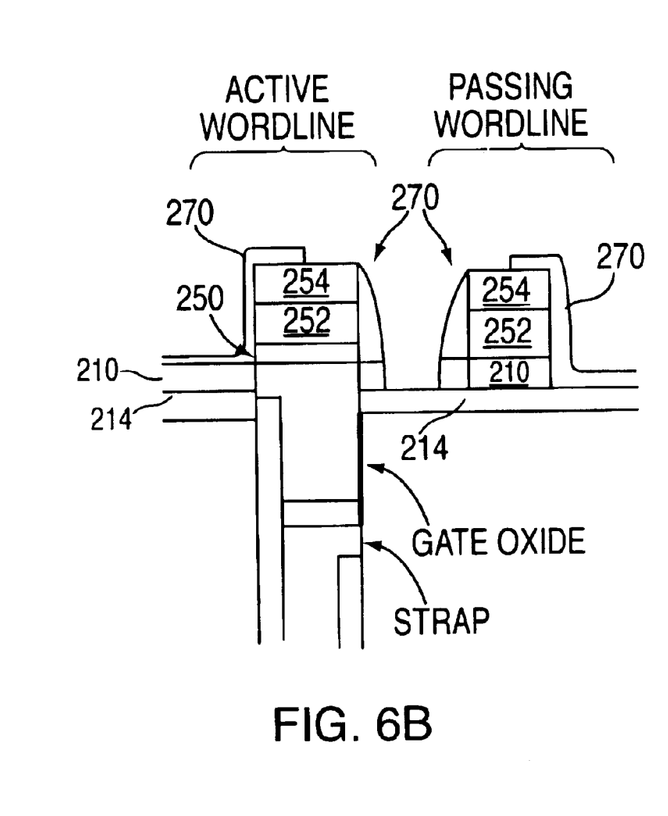
Figure 7A:
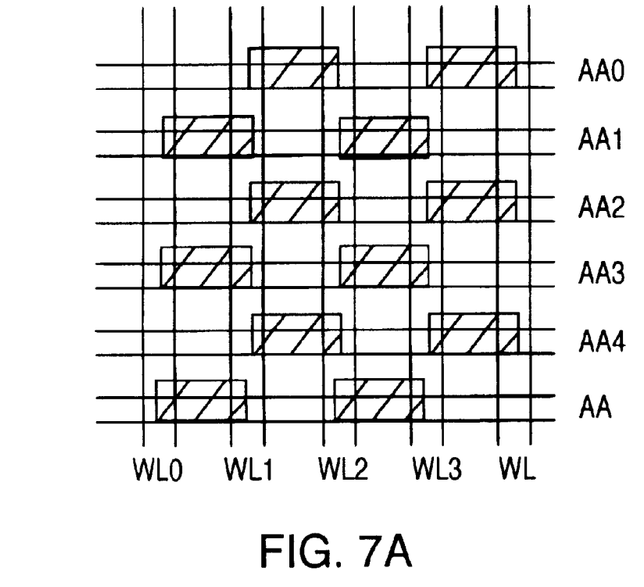
FIGS. 7A and 7B show schematic top down and cross-sectional views depicting a landing pad between adjacent wordlines.
Figure 7B:
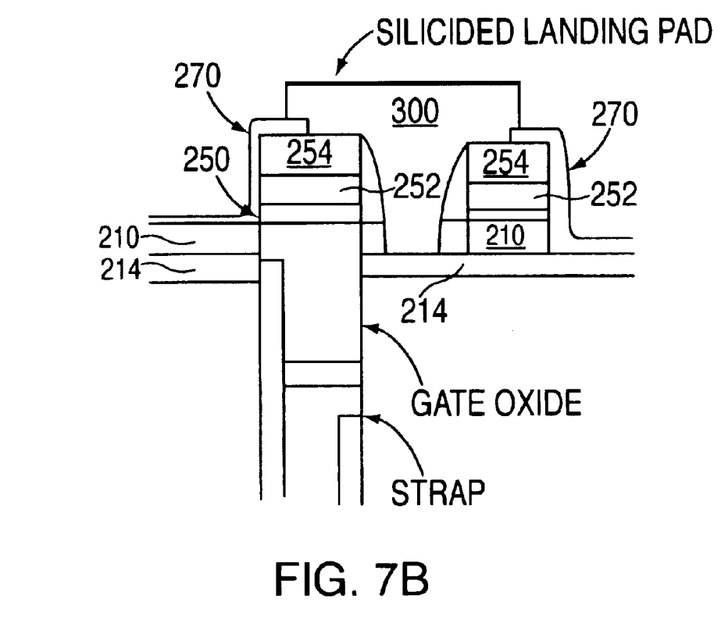

In another embodiment, preferably used for the fabrication of 8F$^2$ vertical DRAM cells, the SiN spacer 270 is selectively etched in regions where the bitline contact is to be made in the manner shown in the top down view of FIG. 6A and corresponding cross-sectional view shown in FIG. 6B. In this process, the spacer 270 is not etched in the same active array regions (AA'') between adjacent wordlines (WL'') where the bitlines are not contacted. The hatched regions show the regions where the SiN spacer 270 is etched. This allows the bitline diffusion 214 to be exposed only in the hatched region. It is important to note that the wordline is isolated from the substrate by the top oxide 210 and is shorted by the bitline diffusion region 214. The deposited polysilicon layer 300 is then patterned as a landing pad resulting in the structure shown in FIGS. 7A and 7B. The landing pads are patterned as shown in FIG. 7 by the hatched region. Optionally, the polysilicon layer 300 may require a CMP planarization and subsequent hardmask as discussed in the previous embodiment. These polysilicon landing pads are then silicided and electrically connected with a subsequent metal wiring level by means of a metal contact. In this embodiment, the metal wiring level serves as the bitline.

Figure 8:
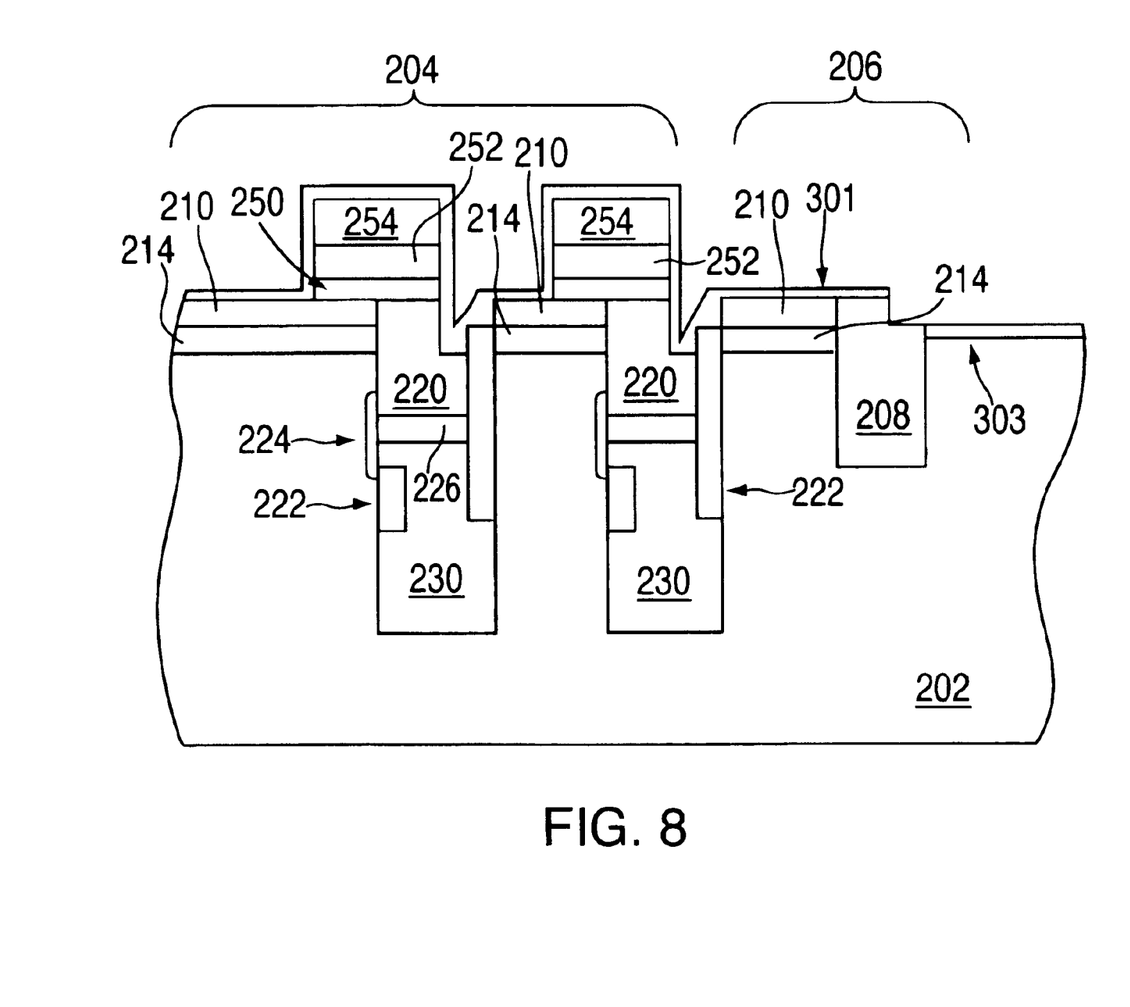
FIGS. 8–10 show schematic cross-sectional views illustrating fabrication of a DRAM array and supports constructed in accordance with an embodiment of the present invention.
Figure 9:
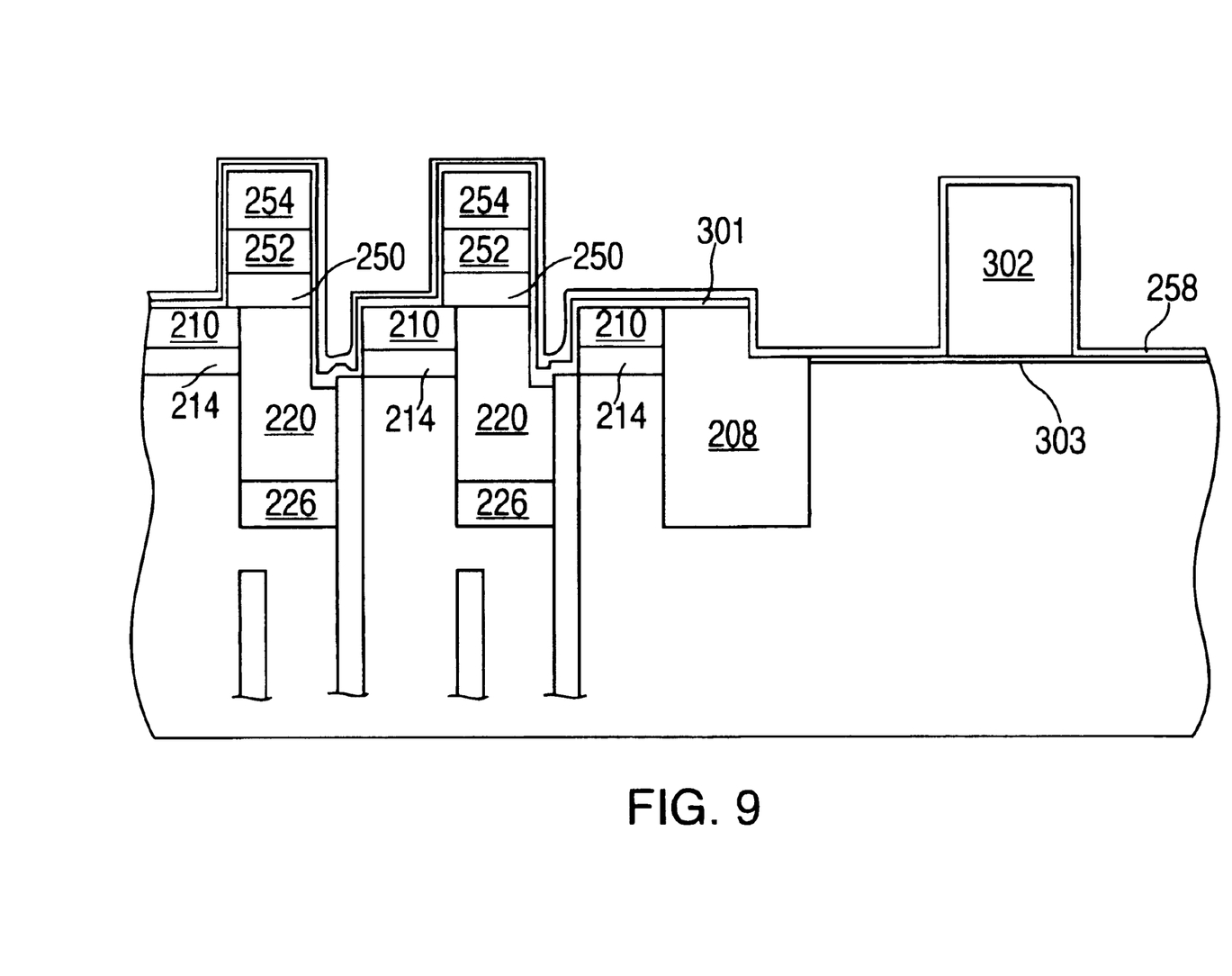

In another embodiment, a barrier layer 250, a conductor 252 and a dielectric layer 254 are deposited onto the structure as shown in FIG. 1. As previously described, the dielectric layer 254 is preferably a combination of TEOS and a thin layer of silicon nitride. The array gate is patterned and etched to the TTO layer 210. A silicon nitride layer 301 is then deposited. A mask is used to selectively etch the silicon nitride layer 301 in the non-array portions 206 of the wafer. The TTO layer 210 is then removed in the non-array portions and a support sacrificial oxide layer (not shown) is thermally grown. During these process steps, the array regions 204 are protected by the silicon nitride layer 301. The support implants (wells and threshold adjust) are performed, the sacrificial oxide layer is stripped and the support gate oxide layer 303 is grown as shown in FIGS. 8 and 9.

Figure 10:
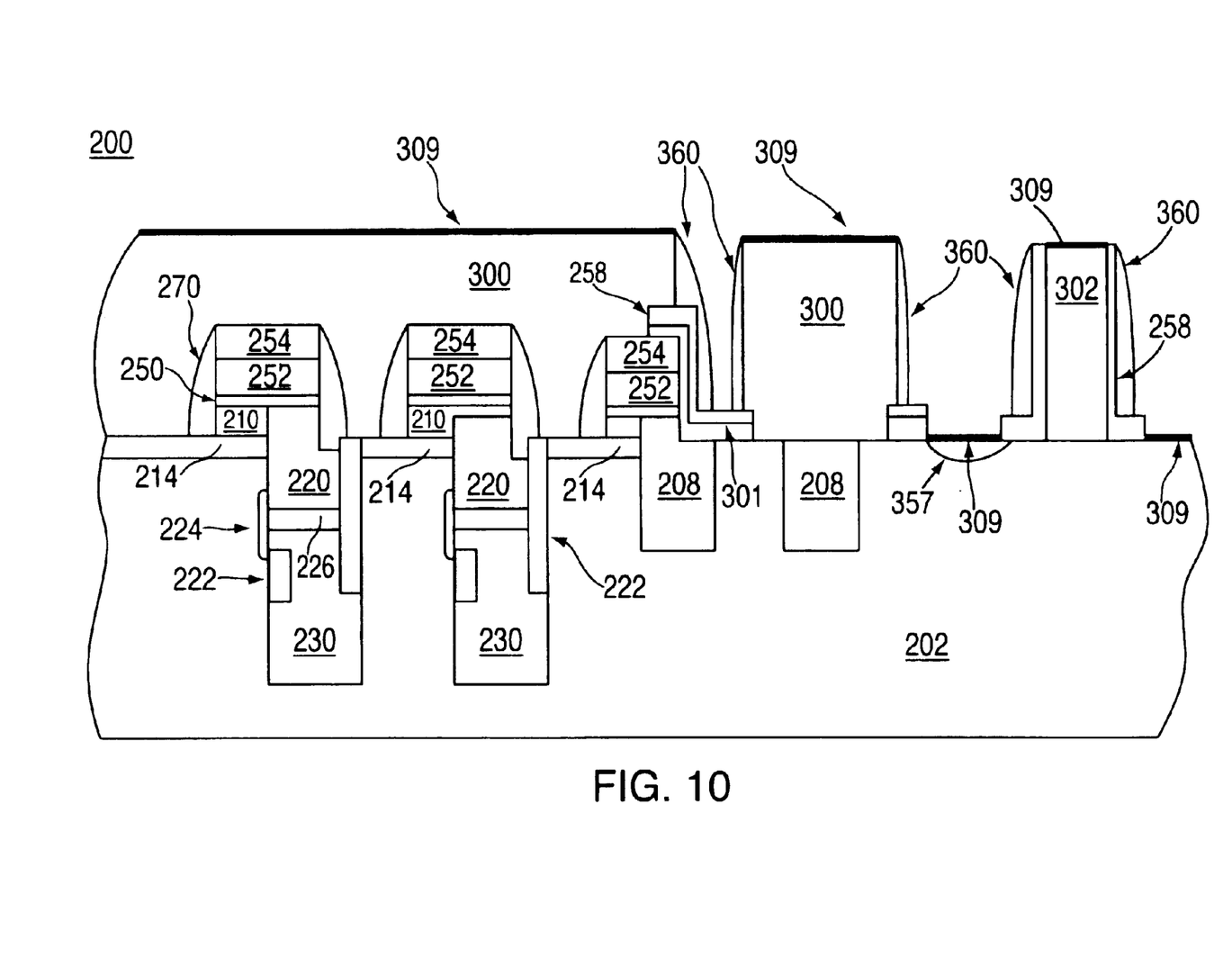

Turning now to FIG. 10, a layer of intrinsic polysilicon 302 is deposited onto the substrate and patterned with the support gate conductor mask. Optionally, a hard mask may be used for this part of the process. The polysilicon layer 302 is then etched to the gate oxide 303 in the support regions 206 and completely cleared selective to the gate cap 254 and silicon nitride layer 301 in the array region. The support extension and halo implants are performed after an optional sidewall oxidation. The PFET implants may be performed after an optional SiN spacer layer is formed (not shown). A barrier nitride layer 258 is then deposited onto the substrate as shown in FIG. 9. Subsequently, a TEOS liner layer 260 is then deposited onto the substrate and removed in the array and in the regions where the local interconnect is to be formed. The TEOS liner is removed by using a photoresist mask and conventional wet etching processes. Then, the SIN layer is removed by exposing the layer to RIE and etching the TTO 210 in the array with a RIE selective to the silicon 202 underlying the array region and the interconnect region. The resist used for the mask is then selectively stripped from the substrate surface.

The etching of the nitride layers 301 and 258 forms the spacer 270 in the array regions. A layer of n+ doped polysilicon 300 is conformally deposited and planarized over the gate stack. An optional BSG hardmask (used for planarization reasons) is used to pattern the n+ doped polysilicon (with a photoresist mask) and the bitlines and local interconnects are defined. Once the BSG is stripped, an additional TEOS layer may be deposited and spacers 360 etched. The nitride in the support gate regions are then etched, the n+ and p+ implants are performed which also dopes the gate stack 302. The gate stack 302, the n+ interconnect and the n+ poly bitline are then silicided. The complete structure is shown in FIG. 10. The rest of the process follows conventional process steps as is recognized by those skilled in the art.

According to the foregoing, the advantages of the invention include at least the following:

1. Separate lithography requirements for the array region advantageously results in a more robust photolithography process window. Those skilled in the art will appreciate the difficulties encountered in photolithographic patterning of memory features and logic support features within the same layer and the resulting advantages by separately patterning the significantly different pitch requirements for the memory and logic regions.

2. A conventional first metal layer, commonly referred to as the M0 layer, is not required for sub-8F$^2$ cells since the bitlines and local interconnects are formed by the salicidation of polysilicon. Elimination of the M0 layer removes the most difficult layer to photolithographically pattern. The M0 layer typically includes features of the smallest dimensions.

Many modifications and variations of the invention will be apparent to those skilled in the art in light of the foregoing disclosure. Therefore, it is to be understood that, within the scope of the appended claims, the invention can be practiced otherwise than has been specifically shown and described.

What is claimed is:

1. A semiconductor device including a dual workfunction support transistor and an embedded DRAM array free of a M0 first metal layer, the semiconductor device comprising:
   a support region comprising a gate structure, source and drain regions adjacent to the gate structure, and a suicide layer disposed on the source and drain regions, wherein the gate structure comprises a dielectric capping layer, a metal conductor and a polysilicon layer;

an array region comprising a plurality of embedded DRAM cells, a bitline diffusion region electrically connecting adjacent DRAM cells, an array gate stack structure, a polysilicon layer, wherein the polysilicon layer includes a silicide surface;

an isolation region, wherein the isolation region electrically separates the support region from the array region; and an interconnect structure disposed on the isolation region comprising a polysilicon layer and a silicide layer formed on the polysilicon layer, said interconnect structure further in contact with at least one diffusion region.

2. The semiconductor device according to claim 1, wherein the isolation region comprises a shallow french isolation region.

3. The semiconductor device according to claim 1, wherein the array gate stack comprises a metallic conductor and a dielectric capping layer.

4. The semiconductor device according to claim 1, wherein the dielectric capping layer comprises a layer of tetraethytorthosilicate and a layer of silicon nitride disposed thereon.

5. A semiconductor device including a dual workfunction support transistor and an embedded DRAM array free of a M0 first metal layer, the semiconductor device comprising:

an active wordline comprising a first gate structure formed on a storage capacitor, wherein the first gate structure comprises a metal conductor layer, a dielectric capping layer and a spacer layer formed on a portion of the first gate structure;

a passing wordline spaced apart from the active wordline, the passing wordline comprising a second gate structure, wherein the second gate structure comprises a metal conductor, a dielectric capping layer, an underlying oxide layer and a spacer layer formed on a portion of the second gate structure;

a bitline diffusion region separating the active wordline from the passing wordline; and a plurality of patterned landing pads comprising polysilicon having a silicide surface, wherein at least one of said plurality of landing pads is in contact with the first gate structure, the second gate structure and the bitline diffusion region.

6. The semiconductor device according to claim 5, wherein the active wordline overlays an embedded DRAM cell.

7. The semiconductor device according to claim 5, wherein the portion of the spacer layer is selectively removed in regions where a bitline contact is to be formed.

8. A semiconductor device including a dual workfunction support transistor and an embedded DRAM array free of a M0 first metal layer, the semiconductor device comprising:

an array region comprising a plurality of embedded DRAM cells, a bitline diffusion region electrically connecting adjacent DRAM cells, an array gate stack structure overlaying each DRAM cell, and a silicide polysilicon layer, wherein the gate structure comprises a metal conductor layer and a dielectric capping layer and wherein the silicide polysilicon layer is in contact with the bitline diffusion region and the dielectric capping layer;

a support region comprising a polysilicon gate structure, a source and a drain region adjacent to the gate structure, and a silicide layer disposed on the gate structure and the source and drain regions; and an interconnect structure overlaying an isolation region, separating the support region from the array region, wherein the isolation region included a silicide polysilicon layer, and said interconnect structure further in contact with at least one diffusion region.

9. The semiconductor device according to claim 8, wherein the isolation region comprises a shallow trench isolation region.

10. The semiconductor device according to claim 8, wherein the isolation region comprises a local oxidation of a silicon surface.

11. The semiconductor device according to claim 8, wherein the dielectric capping layer comprises a layer of tetracthylorthosilicate and a layer of silicon nitride.

* * * * *